United States Patent [19]

Ghislanzoni

[11] Patent Number: 4,961,049
[45] Date of Patent: Oct. 2, 1990

[54] MAGNETICALLY-COUPLED APPARATUS FOR MEASURING ELECTRICAL CURRENT

[75] Inventor: Luca Ghislanzoni, Noordwijk, Netherlands

[73] Assignee: Agence Spatiale Europeenne, Paris, France

[21] Appl. No.: 281,124

[22] Filed: Dec. 7, 1988

[30] Foreign Application Priority Data

Dec. 11, 1987 [FR] France ............................. 87 17313

[51] Int. Cl.[5] .......................................... G01R 19/00
[52] U.S. Cl. .................................. 324/117 H; 324/127
[58] Field of Search ............... 324/117 R, 117 H, 127, 324/250, 251; 323/355, 356, 357, 358

[56] References Cited

U.S. PATENT DOCUMENTS

| | | | |
|---|---|---|---|
| 3,482,163 | 12/1967 | Peek et al. ............................ | 324/251 |
| 3,916,310 | 10/1975 | Stark et al. ........................... | 324/127 |
| 4,255,705 | 3/1981 | Milkovic .............................. | 324/127 |
| 4,682,101 | 7/1987 | Cattaneo ........................... | 324/117 H |

FOREIGN PATENT DOCUMENTS 194225 10/1986 European Pat. Off. .

*Primary Examiner*—Reinhard J. Eisenzopf
*Assistant Examiner*—Edward Urban
*Attorney, Agent, or Firm*—Bell, Seltzer, Park & Gibson

[57] ABSTRACT

The present invention provides current measuring apparatus of the type using magnetic coupling, the apparatus comprising a transformer (Tr) having a gap (E) in which a device (G) is disposed suitable for providing a signal which is a function of the magnetic flux existing in the gap with the primary winding (P) of the transformer conveying the current (I) to be measured. The apparatus includes the improvement of employing a device for separating the high frequency A.C. components from the low frequency A.C. components and the D.C. component of the current to be measured. In addition, a device for providing a second signal proportional to the high frequency A.C. component is used, along with a summing device ($\epsilon$) for summing a first signal and the second signal as provided by the device located in the gap.

The invention is applicable in the electrical industry to measure current.

13 Claims, 8 Drawing Sheets

MAGNETICALLY-COUPLED APPARATUS FOR MEASURING ELECTRICAL CURRENT

The present invention relates to an apparatus of the magnetically coupled type for measuring electrical current which may be A.C. and/or D.C.

BACKGROUND OF THE INVENTION

Galvanomagnetic devices are used as detector components for measuring electrical currents. Detailed information on such devices can be found in the technical literature, and reference may be made, for example, to Siemens' data book entitled "Galvanomagnetic devices" published 1976/1977. There are two different techniques for performing the measurement.

The first technique is one in which, at least in theory, there ought to be no need to perform compensation for variations in magnetic flux. The corresponding apparatus for implementing the technique essentially comprises a magnetic circuit including a gap in which the galvanomagnetic device is inserted. The magnetic circuit is excited by current flowing in a winding. Variations in the flux correspond to variations in the input current in accordance with the following equation:

$$\left| \frac{dB^*}{dt} \right| = \frac{L}{NA_s} \cdot \left| \frac{di}{dt} \right| = \frac{L}{NA_s} \omega |i| \quad (1)$$

where:
- $B^*$ is the value of the magnetic induction;
- $i$ is the input current at frequency $f$;
- $\omega = 2\pi f$, i.e. the angular frequency;
- $N$ is the number of turns in the winding;
- $A_s$ is the area of the magnetic circuit surrounded by said winding; and
- $L$ is the inductance, including the effect of the magnetic circuit.

Given that the electric connection cables associated with the galvanomagnetic device constitute a loop whose area cannot be reduced completely to zero, and that there therefore remains a small residual loop area having a finite value A which is other than zero, the electrical voltage $v_i^*$ induced between the output terminals is defined by the following expression which is applicable on the assumption that magnetic leakage (and thus leakage inductance) and also the increase in the effective gap area are negligible:

$$v_i^* = -A \frac{dB^*}{dt} \quad (2)$$

Using the same assumptions, it is possible to express the voltage $v_i^*$ as a fraction of the voltage $v_s$ induced in the said winding, i.e.

$$v_i^* = \frac{v_s}{N} \frac{A}{A_s} \quad (3)$$

Further, if the inductance L is conventionally expressed as the product of the square of the number of turns $N^2$ multiplied by a constant K, i.e. $L = KN^2$, it is also possible to express $v_i^*$ that appears in equation (2) as follows, making use of equation (1):

$$|v_i^*| = |i| \omega K \frac{A}{A_s} N \quad (4)$$

Equation (4) shows that the induced electrical voltage is directly proportional to the number of turns N and to the angular frequency $\omega$.

This means that the value of $v_i^*$ is such that, in practice, it is generally necessary to provide compensation using techniques known to the person skilled in the art but contributing to further complication of the design of the measuring circuit.

Apparatuses of this category therefore suffer from the drawback of requiring a very high value of inductance (i.e. a high number of turns) in order to obtain the desired sensitivity for the measuring device: this condition gives rise to a relatively high value for the voltage induced between the terminals of the device and corresponds to behavior which is far from ideal.

The second technique of measuring electrical current using galvanometric devices is a technique in which variations of magnetic flux are compensated actively.

The corresponding apparatus for implementing the second technique differs from that used for implementing the above-described first technique in that the magnetic circuit includes an auxiliary winding in addition to the main excitation winding. A negative feedback circuit controls the current flowing through said auxiliary winding in such a manner as to provide full compensation for variations in magnetic flux, i.e. so as to obtain a value for the magnetic induction B which is zero or constant.

The negative feedback circuit must be designed in such a manner as to have a passband which goes from zero frequency (corresponding to D.C.) up to the desired frequency (for A.C.).

In any event, flux variation is very small (and in theory zero) such that the induced voltage is effectively compensated in practice.

Further, the impedance of the measuring device is also very low (and in theory zero).

However, although an apparatus for implementing the second technique behaves in a manner which is very close to ideal, practical realization of the above-mentioned negative feedback circuit is relatively complex because of the wide bandwidth that needs to be provided. Further, if high current values are involved, it is necessary for the auxiliary compensation winding to include a large number of turns in order to reduce the required compensation current, i.e. to reduce the power required for compensation purposes.

The range of applications for which said second category of apparatuses can be used is therefore limited by the above-mentioned constraints.

The object of the present invention is to provide a magnetically coupled current measuring apparatus which satisfies practical requirements better than known prior apparatuses for the same purposes, and in particular which:

requires no compensation for magnetic flux variation, and in particular which does not require the very complex compensating negative feedback circuits of the prior art to be used;

has performance close to that of an ideal current measuring apparatus (characterized by zero impedance) by having extremely low impedance, thereby eliminating the drawback which limited the use of prior art magnetically-coupled current measuring apparatuses due to their high impedance values; and greatly reduced iron losses, thereby eliminating the drawback constituted by the limited range of materials that can be selected for the magnetic circuit.

Apparatus in accordance with the present invention uses a third measurement technique which may be referred to as a "passive" (or intrinsic) technique for compensating variations in magnetic flux, and which makes it possible to realize apparatuses (i.e. apparatuses belonging to a third category) whose design and structure are greatly simplified while still maintaining the advantages of apparatuses of the second category.

In addition, it should be emphasized that the negative feedback which they make use of intrinsically (i.e. the negative feedback due to their specific structure), is much more effective, particularly at high frequency, than the feedback which can be obtained from any kind of active negative feedback circuit.

SUMMARY OF THE INVENTION

The present invention provides a current measuring apparatus of the magnetically coupled type, the apparatus comprising a transformer provided with:

a magnetic circuit defined by a core of ferromagnetic material having a gap and a device placed in the gap for providing a first signal ($v_i$) which is a function of the magnetic flux existing in the gap; and a primary winding having the current to be measured flowing therethrough and a secondary winding, with each of the windings being disposed around said magnetic circuit and each including its own number of turns ($N_p$, $N_s$);

the apparatus further including:

separator means for separating the D.C. component and the low frequency A.C. components in the current to be measured (I) from the high frequency A.C. components ($i_r$) of the same current;

means for generating a second signal ($v_r$ or $v_{ad}$) proportional to said high frequency A.C. components;

said device placed in the gap providing said first signal ($v_i$) which is also proportional to said D.C. component and said low frequency components; and summing means for summing said first and second signals, said summing means thus providing a third signal which is proportional to the current to be measured (I).

In a preferred embodiment of apparatus in accordance with the invention, said separator means for separating the D.C. component and the low frequency A.C. components from the high frequency A.C. components is constituted by said secondary winding which is substantially short circuited.

In another advantageous embodiment of apparatus in accordance with the invention, the means providing said second signal is constituted by a very low value impedance, of the order of a few milliohms, inserted in the secondary winding, thereby having substantially no effect on the short circuit operation thereof, with said second signal being defined by the voltage existing across the terminals of said impedance.

In a preferred disposition of this embodiment, the impedance looping the secondary winding is constituted by a pure resistance.

In another preferred embodiment of preferred apparatus in accordance with the invention, the means providing said second signal is constituted by an amplifier fed by said secondary winding, with the input and the output of said amplifier sharing a common terminal, the transfer admittance between the input and the output being very high (theoretically infinite), such that the input impedance to the amplifier and the output impedance from the amplifier are very low (theoretically zero), said second signal being defined by the voltage existing between the terminals of the output impedance of the amplifier equivalent to the transfer admittance between the input and the output of said amplifier.

In another preferred embodiment of apparatus in accordance with the invention, the means providing said second signal is constituted by a third winding disposed around said magnetic circuit, said second signal being constituted by the voltage existing across the terminals of said third winding, and said third winding includes a very large number of turns ($N_{ad}$).

In another preferred embodiment of apparatus in accordance with the invention, the core of the magnetic circuit is made of non-laminated soft iron.

In another advantageous embodiment of apparatus in accordance with the invention, said means for summing said first and second signals is constituted by a wideband operational amplifier which has its input terminals connected to respective output terminals from said means providing said first and second signals, with the other terminals thereof being common.

In another advantageous embodiment of an apparatus in accordance with the invention, a wideband amplifier amplifies said second signal while a mediumband amplifier amplifies said first signal.

In addition to the above dispositions, the invention also includes other dispositions which appear from the following description.

BRIEF DESCRIPTION OF THE DRAWINGS

Embodiments of the invention are described by way of example with reference to the accompanying drawings, in which.

MORE DETAILED DESCRIPTION

Figure 1:
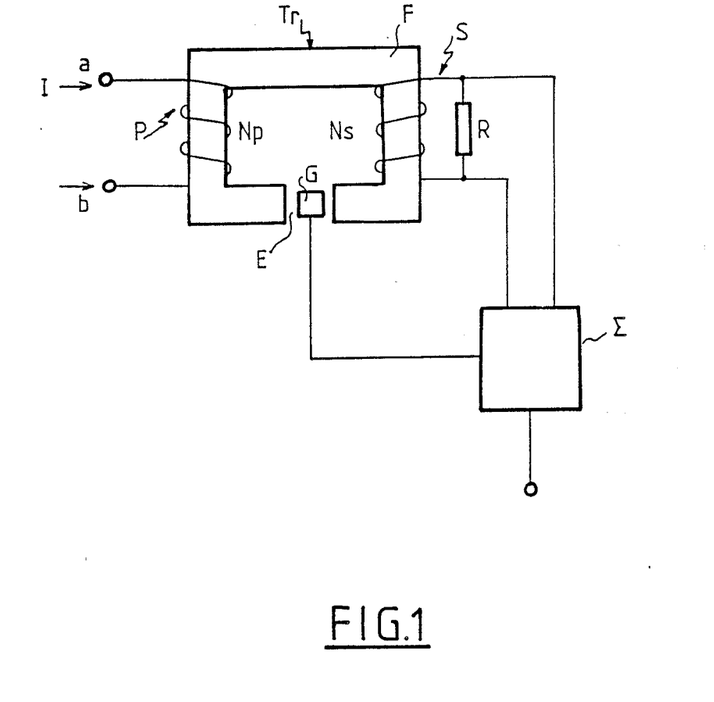
FIG. 1 is a first theoretical circuit diagram of a measuring apparatus in accordance with the invention.

FIG. 1 is a theoretical diagram of a current measuring apparatus in accordance with the invention.

$T_r$ is a transformer whose magnetic circuit F has a gap E.

R is a resistor of very low value, e.g. about 10 mΩ.

G is a galvanomagnetic device (e.g. a Hall effect generator or any other device providing a signal across its output terminals which is a function of magnetic flux), said device being placed in the gap.

Σ is an active or passive summing circuit whose output is a function of the input current I to be measured flowing in the primary winding P which is constituted by $N_p$ turns, where the secondary winding S has $N_s$ turns.

Figure 2:
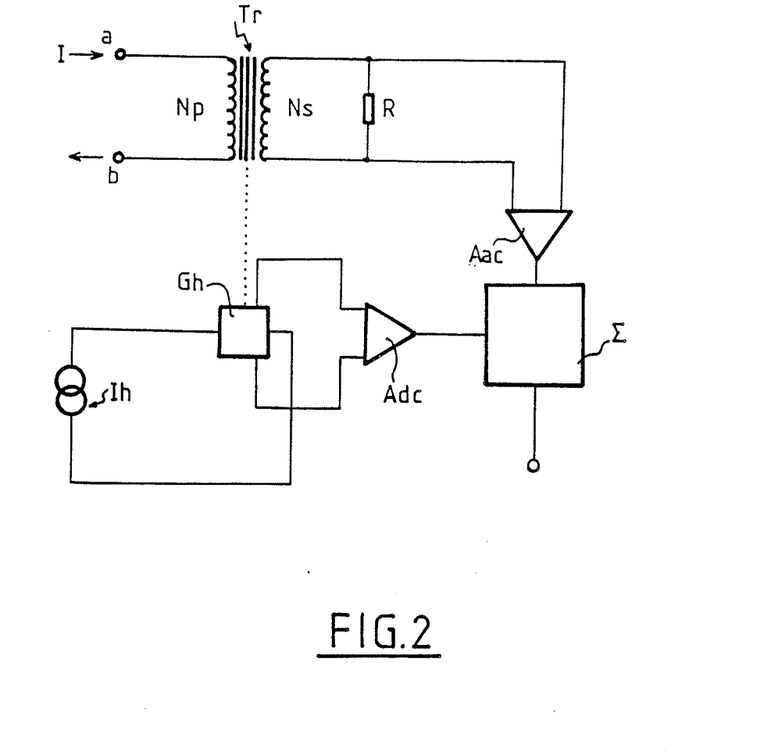
FIGS. 2 and 3 show two possible practical configurations of the FIG. 1 circuit, for the case where a Hall effect generator is available in the gap in the magnetic circuit of the transformer.
Figure 3:
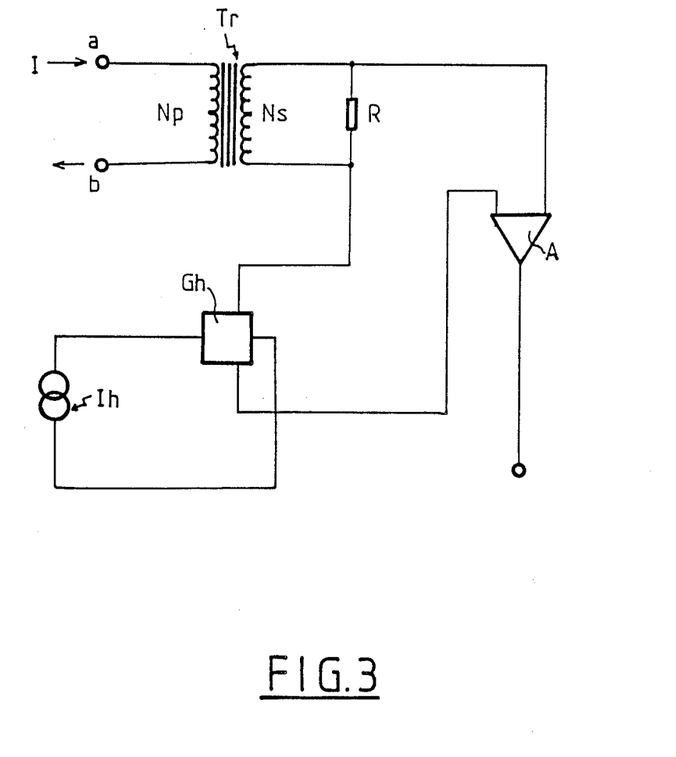

FIGS. 2 and 3 show two possible configurations of the circuits shown in FIG. 1 using a Hall effecg generator $G_h$, for example, whose interaction with the magnetic field of the transformer is represented diagrammatically by a dashed line. $I_h$ is the current source feeding the generator $G_h$.

In FIG. 3, A is a wideband amplifier.

In FIG. 2, $A_{dc}$ is a mediumband amplifier having very high gain whose input is defined by the voltage due to the Hall effect as made available at the output terminals of the Hall effect generator, and $A_{ac}$ is a wideband amplifier of medium gain which is sensitive to the high frequency alternating voltage that exists across the terminals of the resistor R.

Figure 2A:
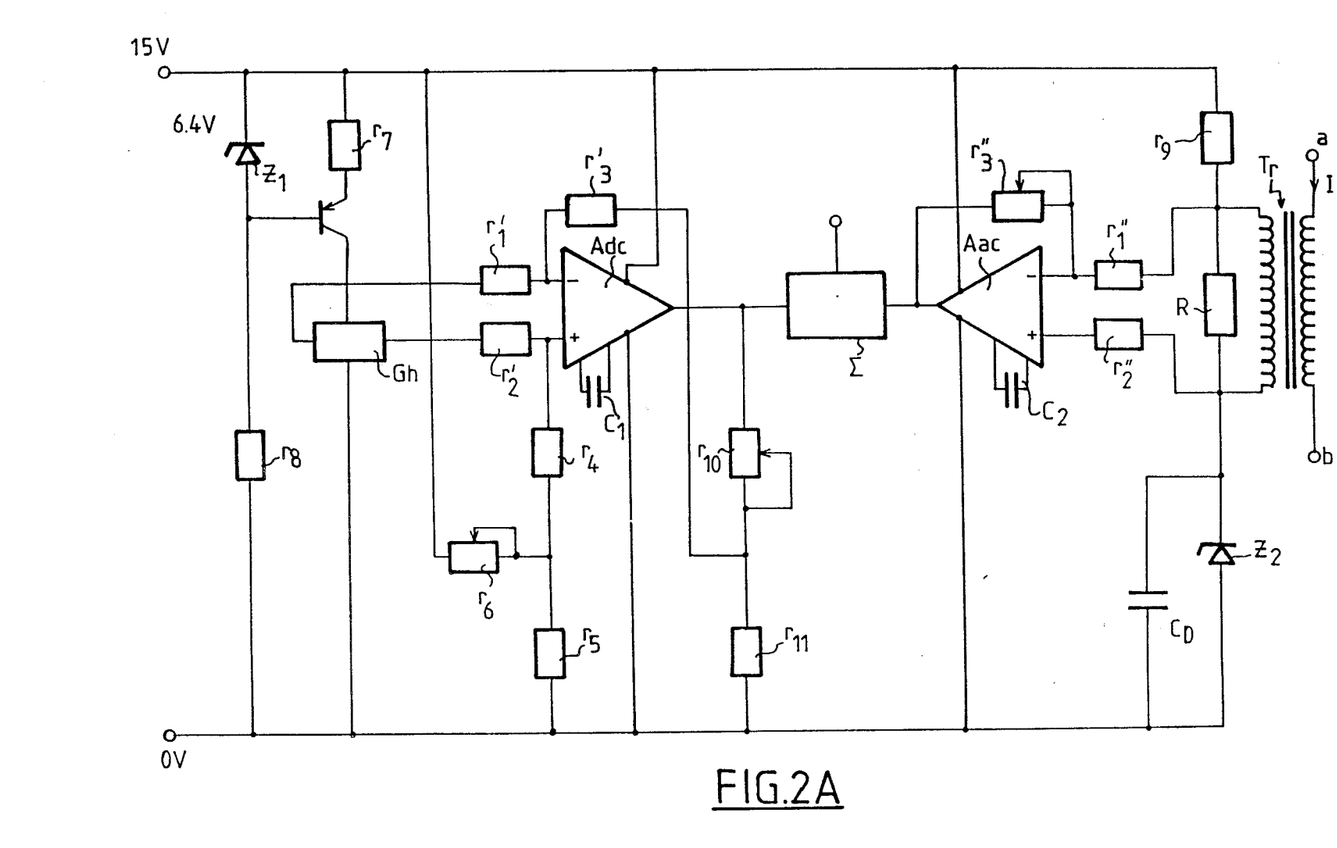
FIG. 2A is a detailed circuit diagram of one possible implementation of the circuit shown in FIG. 2.

FIG. 2A is a detailed circuit diagram of one possible configuration for the circuit shown in FIG. 2, said circuit diagram showing the transformer $T_r$, the Hall effect generator device $G_h$, the amplifiers $A_{dc}$ and $A_{ac}$ (which are of the type referenced LM 308) together with the resistor R connected across the terminals of the secondary winding. It is assumed that the resistance of the resistor R shown in the circuit of FIG. 2A is 50 mΩ and the other circuit components have the following values:

$r'_1 = r'_2 = r'_3 = 10$ kΩ
$r''_1 = r''_2 = r_5 = r_7 = 1$ kΩ
$r''_3 = 200$ kΩ
$r_4 = r_8 = r_9 = 8$ kΩ
$r_6 = r_{10} = 100$ kΩ
$r_{11} = 470$ Ω
$C_1 = C_2 = 3.3$ pF.

The circuit of FIG. 2A also shows a 2N2907-A type PNP transistor and two Zener diodes $Z_1$ and $Z_2$.

$C_D$ is the decoupled capacitance of a decoupling capacitor for decoupling the capacitance between the primary and the secondary windings.

Figure 4:
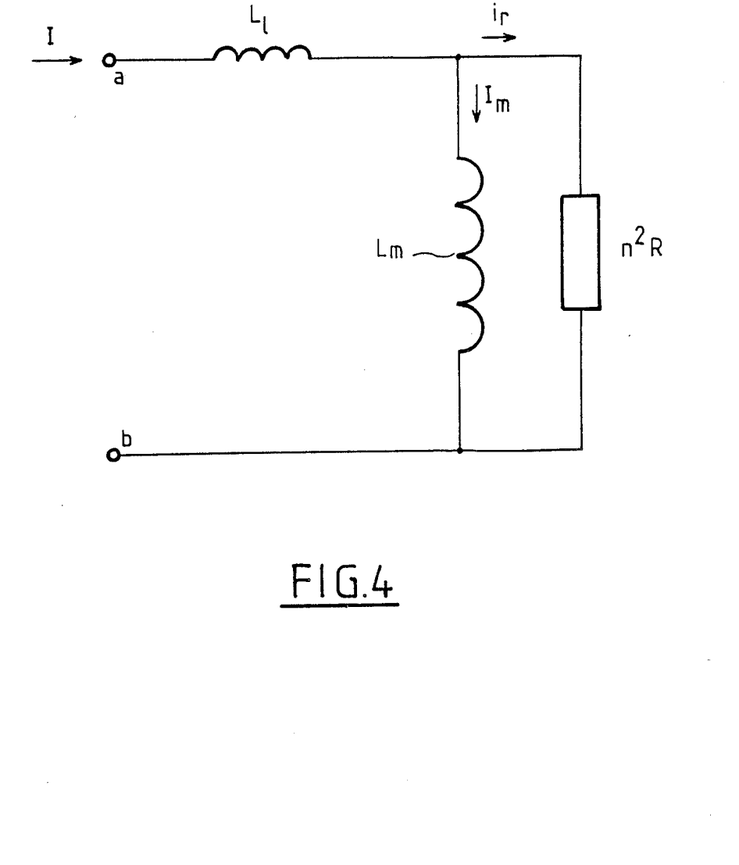
FIG. 4 is the equivalent circuit diagram of the transformer shown in FIGS. 1 to 3.

FIG. 4 is an equivalent circuit diagram of the measuring device shown in FIGS. 1 to 3.

In this equivalent circuit $L_l$ is the leakage inductance, $L_m$ is the inductance which takes account of the magnetic circuit, and $n^2R$ is the equivalent resistance of the resistor R connected across the secondary circuit of the transformer and seen from the primary circuit, with $n = N_p/N_s$.

The input current I generally comprises a D.C. component $I_{dc}$ and an A.C. component $i(\omega)$, where $\omega = 2\pi f$. When the D.C. component $I_{dc}$ is present, it necessarily flows through $L_m$ in the above-mentioned equivalent circuit, given that its $n_2R$ branch relates solely to the "transformer" effect.

Writing $i_m(\omega)$ and $i_r(\omega)$ as the A.C. currents which together constitute the current $i(\omega)$ and which flow respectively through $L_m$ and through $n^2R$, it is clear that $i(\omega) = i_m(\omega) + i_r(\omega)$, and, in general, that the current $I_m$ which passes through $L_m$ is given by $I_m = I_{dc} + i_m$, with $n^2R$ having substantially only the current $i_r$ passing therethrough. The current I is thus:

$$I = I_m + i_r \quad (5)$$

The current $I_m$ is a function of the magnetic flux and is detected by the device G in the form of a voltage signal $v_i$, whereas the current $i_r$ may be detected by means of the voltage $v_r$ which is induced in the secondary winding S, with $i_r$ being related thereto by the equation:

$$v_r = i_r n^2 R \quad (6)$$

The currents $i_r(\omega)$ and $i_m(\omega)$ can easily be expressed as a function of current $i(\omega)$ using the following expressions:

$$|i_r(\omega)| = |i(\omega)| \frac{\omega L_m}{\sqrt{(n^4R^2 + \omega^2 L_m^2)}} \quad (7)$$

$$|i_m(\omega)| = |i(\omega)| \frac{n^2 R}{\sqrt{(n^4R^2 + \omega^2 L_m^2)}} \quad (8)$$

These expressions show clearly that when $\omega >> n^2R/L_m$, then:

$$|i_r(\omega)| \approx |i(\omega)|$$

whereas when $<< n^2R/L_m$, then:

$$|i_m(\omega)| \approx |i(\omega)|$$

which means that the D.C. amplifier $A_{dc}$ does not need a large wideband amplifier (a bandwidth of up to 1 kHz is sufficient in practice), with the total bandwidth being defined by the passband of the A.C. amplifier $A_{ac}$.

The above shows clearly that one result of the secondary winding being practically short-circuited is that the A.C. current $i_r$ passing therethrough includes high frequency components.

In contrast, the A.C. current $i_m$ which takes account of the magnetic circuit effect, includes only low frequency components together with a possible D.C. component, thereby giving rise only to very small variations in the flux in the magnetic circuit and thus justifying the fact that a device in accordance with the invention does not need said flux variations to be compensated.

Equation 5 thus shows that by closing the secondary winding substantially on a short circuit (given the very small resistance of the resistor R) it is possible to separate the D.C. components together with the low frequency A.C. components as presented by $I_m$, from the high frequency A.C. components as represented by $i_r$.

Given that the signal $v_i$ provided by the device G is proportional to the magnetic induction, it follows that this signal and said induction correspond to the D.C. component and to the low frequency A.C. components, whereas the signal $v_r$ available from the terminals of the resistor R is proportional to the high frequency components.

Thus, the sum of these two signals $v_i$ and $v_r$ is an accurate representation of the input current I to be measured.

Under the same conditions as specified above, it is also easy to verify that the impedance of the measuring apparatus between its inputs terminals $\underline{a}$ and $\underline{b}$ is given by:

$$|Z_{ab}| \approx \sqrt{(n^4R^2 + \omega^2 L_l^2)}, \text{ for } \omega >> n^2R/L_m \quad (9) \text{ and}$$

$$|Z_{ab}| \approx \omega \cdot (L_m + L_l), \text{ for } \omega << n^2R/L_m \quad (10)$$

with expression (9) also representing the maximum value of the impedance $|Z_{ab}|_{max}$ which is equal to $n^2R$ when the leakage inductance $L_l$ is negligible.

Assuming that the input current is defined by a sinusoidal current $i$ and that $L_l \approx 0$, the voltage $v_i$ induced at the terminals of the device $G_h$ may be expressed as a function of the voltage $v_{ab}$ between input terminals:

$$|v_i| = \left|\frac{v_{ab}}{N_p}\right| \left|\frac{A}{A_s}\right| \quad (11)$$

If $v_{ab}$ is expressed as the product of $i_r$ multiplied by $n^2R$, it is also possible to write:

$$|v_i| = \frac{1}{N_p} \frac{A}{A_s} |i| \frac{n^2R\omega L_m}{\sqrt{(n^4R^2 + \omega^2 L_m^2)}} \quad (12)$$

From equation (12), it is easy to determine the maximum value $V_{i,max}$ of $|v_i|$ presented thereby at high frequencies:

$$V_{i,max} = \frac{1}{N_p} \frac{A}{A_s} |i| n^2R \geq |v_i| \quad (12b)$$

Equation (12b) shows that this maximum value is independent of frequency and that it is inversely proportional to the number of turns $N_p$ of the primary winding, and this is in contrast to above-mentioned equation (4) which relates to the first prior art measuring method.

For equal conditions concerning similar magnitudes, the ratio of equations (4) and (12b) gives:

$$\frac{|v_i^*|}{V_{i,max}} = \frac{\omega K N^2}{n^2 R} = \frac{\omega L_m}{n^2 R} \quad (13)$$

where $L_m = KN^2$ represents the inductance taking account of the magnetic circuit effect, which is assumed to be equal in both cases.

Assuming that:
$L_m = 100 \, \mu H$
$R = 10 \, m\Omega$
$n = 1$
$f = 100 \, kHz$
equation (13) gives a ratio $$|v_i^*|/V_{i,max} \approx 6.3 \times 10^3$$

which shows that an apparatus in accordance with the invention can be used for measuring a voltage which is considerably less than that which can be measured using an apparatus that implements the first above-mentioned prior art method, and that this is achieved merely by adding a secondary winding to the magnetic circuit which is looped via a load constituted by a very low value of resistance (and in general by a very low value of impedance).

Further, if the variation in magnetic induction is taken into consideration by analogy with above-mentioned equation (1), this variation can be expressed for an apparatus in accordance with the present invention as follows:

$$\left|\frac{dB}{dt}\right| = \frac{L_m \omega |i_m|}{N_p A_s} = \frac{\omega L_m}{N_p A_s} \frac{|i| n^2 R}{\sqrt{(n^4 R^2 + \omega^2 L_m^2)}} \quad (14)$$

In this case also, it is possible to calculate the maximum value of said variation in magnetic induction, as presented at high frequencies:

$$\left|\frac{dB}{dt}\right|_{max} = \frac{\omega L_m}{N_p A_s} \cdot \frac{|i| n^2 R}{\omega L_m} = \frac{n^2 R |i|}{N_p A_s} \geq \left|\frac{dB}{dt}\right| \quad (14b)$$

Again assuming that all corresponding magnitudes are equal, the ratio between equations (1) and (14b) gives:

$$|dB^*/dt|/|dB/dt| \geq \omega L_m/n^2 R \quad (15)$$

which equation, naturally, agrees with equation (13).

However, given that magnetic losses are approximately proportional to $|dB/dt|^2$ (more exactly they are proportional to $\omega^\alpha B^\beta$ where $\alpha$ and $\beta$ are appropriate coefficients as a function of frequency), it is thus clear that apparatus in accordance with the invention can reduce magnetic losses by a factor which is substantially equal to $10^7$ in comparison with the losses that take place in an apparatus implementing the first method of the prior art.

This has the unexpected consequence that it is no longer necessary for the magnetic circuit to be made of ferrite which is a very fragile material that is difficult to shape, nor is it necessary for it to be laminated.

In a prototype made using non-laminated soft iron, with $R = 50 \, m\omega$, $L_m = 80 \, \mu H$, a sinusoidal input current with a peak-to-peak amplitude of 1 amp between its positive and negative maximum values, and a frequency $f = 100 \, kHz$, the total losses in the iron and the copper were evaluated as being equal to 40 mW, with 6.5 mW being dissipated in the resistor R.

Figure 5:
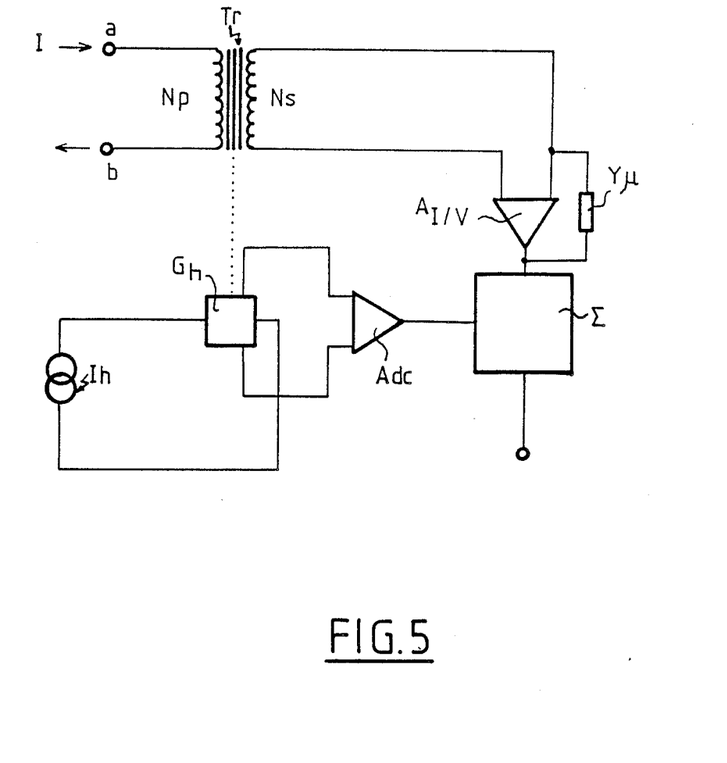
FIG. 5 shows a variant embodiment of the apparatus shown in FIG. 1.

The values calculated from equations (12)–(12b) and from equations (14)–(14b) may be further reduced by means of an amplifier $A_{I/V}$ (see FIG. 5) which is fed from the secondary winding S and whose input and output include a common terminal. If the very high (theoretical infinite) transfer admittance between the input and the output of the amplifier $A_{I/V}$ is written $Y_\mu$, and assuming that the gain of the amplifier is much greater than unity, application of the Miller theorem makes it possible to state that said admittance is reproduced unchanged at the output and is multiplied by the gain (with a change of sign) at the input. This means that the amplifier actually has an input impedance and an output impedance $Z_\mu = 1/Y_\mu$ which is very low (and theoretically zero), as required for measuring apparatus in accordance with the invention to operate.

Figure 7:
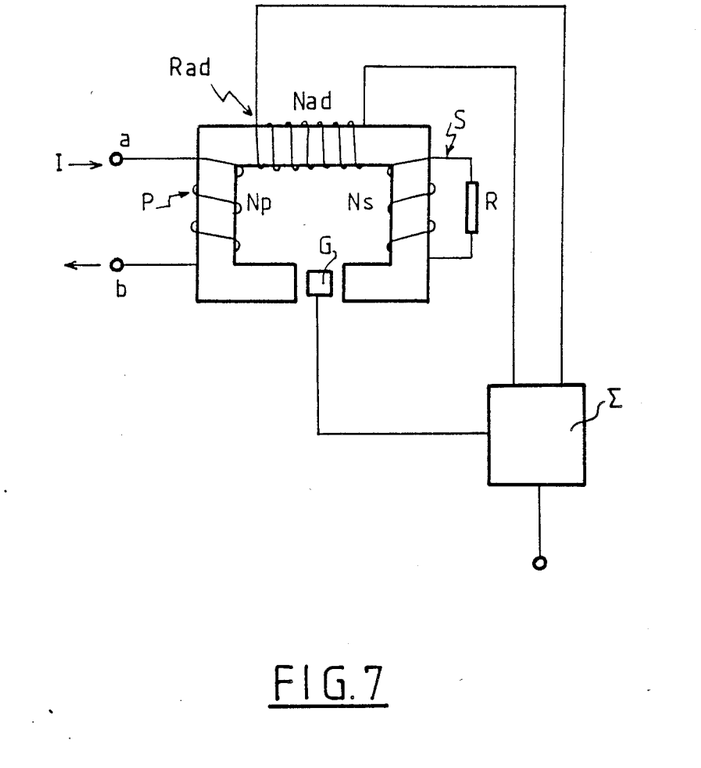
FIG. 7 shows another variant embodiment of the FIG. 1 apparatus.

The performance of measuring apparatus in accordance with the invention can be further improved by adopting the configuration shown in FIG. 7, i.e. by using a third winding $R_{ad}$ including a very large number of turns $N_{ad}$ and by using the voltage $v_{ad}$ available at the terminals of the winding $R_{ad}$ as a signal proportional to the sum of the high frequency A.C. components of the current I to be measured (represented by the term $i_r$ as mentioned above).

Assuming, as mentioned above, that the leakage inductance $L_l$ is negligible, the voltage $v_{ab}$ across the input terminals of the apparatus can be expressed as being practically equal to $n^2 R \cdot i_r$.

The value of $v_{ad}$ can therefore be calculated from the following ratio:

$$\frac{v_{ab}}{v_{ad}} = \frac{N_p}{N_{ad}}$$

which makes it possible to write:

$$v_{ad} = n^2 R \cdot i_r (N_{ad}/N_p)$$

Given that said additional winding does not pass current and therefore does not consume electrical power, the number of turns $N_{ad}$ can thus be made as high as possible with the only limits being essentially practical and related to problems of expense and bulk.

The FIG. 7 circuit means that the resistance of the resistor R inserted in the secondary winding can be reduced to the point where it is constituted solely by the resistance of the corresponding secondary winding S.

Further, by virtue of having a relatively high value of voltage across the terminals of the additional winding $R_{ad}$ it is possible to increase bandwidth (virtually up to infinity if no amplification is required).

Figure 6:
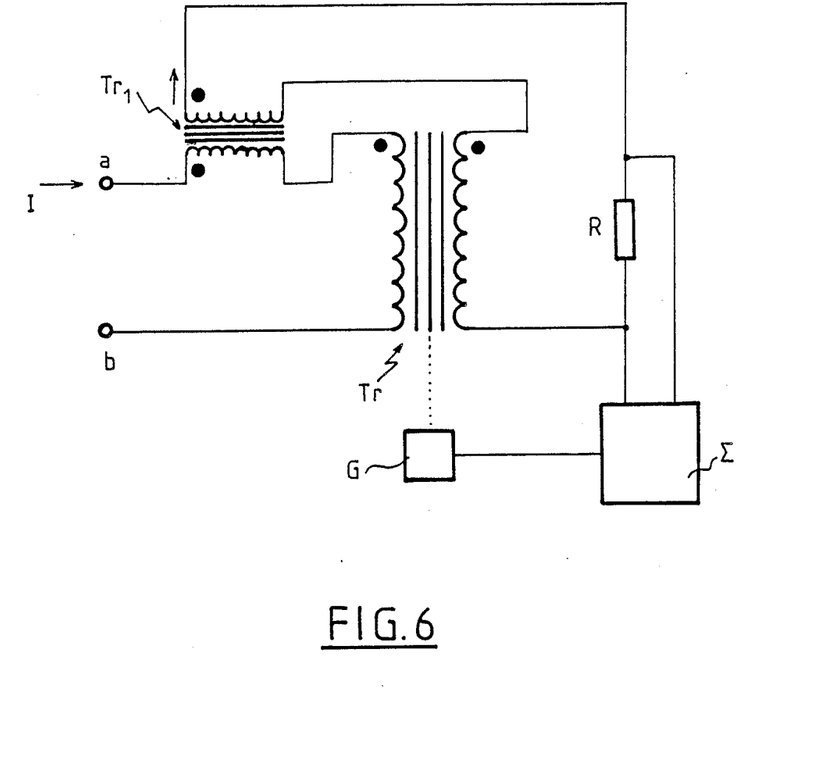
FIG. 6 is the equivalent circuit of the configuration shown in FIG. 1.

The configuration of the circuit shown in FIG. 1 can be generalized as shown in FIG. 6 which shows a solution which is electrically equivalent to that shown in FIG. 1.

These two figures differ essentially in that the current I to be measured passes no longer solely through the primary winding of a transformer $T_r$ of the above-specified type, but now also passes through the primary winding of a transformer $T_{r1}$, with the two primary windings being connected in series, as are the two corresponding secondary windings.

As can be seen from the above, the invention is not limited to the embodiments and the applications which have been described in detail. On the contrary, the invention extends to any variant which may occur to the person skilled in the art without going beyond its scope.

I claim:

1. Current measuring apparatus of the magnetically coupled type, the apparatus comprising a transformer provided with:
   a magnetic circuit defined by a core of ferromagnetic material having a gap and a device placed in the gap for providing a first signal which is a function of the magnetic flux existing in the gap; and
   a primary winding having the current to be measured flowing therethrough, and a substantially short circuited secondary winding, with each of the windings being disposed around said magnetic circuit and each including its own number of turns;
   the apparatus further including:
   separator means for separating the D.C. component and the low frequency A.C. components in the current to be measured from the high frequency A.C. components of the same current, wherein said separator means for separating the D.C. component and the low frequency A.C. components from the high frequency A.C. components is constituted by said secondary winding which is substantially short circuited;
   means for generating a second signal proportional to said high frequency A.C. components, said means providing said second signal being constituted by a third winding disposed around said magnetic circuit, and said second signal being constituted by the voltage existing across the terminals of said third winding, wherein said third winding includes a very large number of turns;
   said device placed in the gap providing said first signal, said first signal being proportional to the sum of said D.C. component and said low frequency A.C. components; and
   summing means for summing said first and second signals, said summing means thus providing a third signal which is proportional to the current to be measured.

2. Apparatus according to claim 1 and further including means providing a very low value impedance, of the order of a few milliohms, in said secondary winding, thereby having substantially no effect on the short circuit operation thereof.

3. Apparatus according to claim 2 wherein said impedance in said secondary winding is constituted by a pure resistance.

4. Apparatus according to claim 2, wherein said impedance of said secondary winding is constituted by the resistance of said secondary winding.

5. Apparatus according to claim 1, and further including another transformer having a primary winding and a secondary winding, and wherein said primary winding of said first-mentioned transformer is connected in series with said primary winding of said other transformer, and said secondary winding of said other transformer is connected in series with said secondary winding of said first-mentioned transformer.

6. Apparatus according to claim 1, wherein said core of said magnetic circuit is made of non-laminated soft iron.

7. Current measuring apparatus of the magnetically coupled type, comprising:
   a transformer having a core of ferromagnetic material, said core defining a magnetic circuit and having a gap therein;
   a primary conductor of the current to be measured, said conductor being adjacent said transformer core and passage of said current through said primary conductor producing magnetic flux in said magnetic circuit;
   galvomagnetic means in said gap of said magnetic circuit for generating a first signal substantially proportional to the sum of the D.C. and low frequency A.C. components of said current to be measured;
   passive secondary winding means adjacent said magnetic circuit for generating a signal proportional to the A.C. component of said current to be measured, said passive secondary winding means being substantially short circuited;
   and summing means for summing said first and second signals and for providing a third signal proportional to said current to be measured.

8. Apparatus according to claim 7, wherein said secondary winding means includes means providing a very low value impedance on the order of a few milliohms, said impedance-providing means having substantially no effect upon the short-circuited condition of said winding means, and said second signal being defined by the voltage existing across terminals of said impedance-providing means.

9. Apparatus according to claim 8, wherein said impedance-providing means is a pure resistance.

10. Apparatus according to claim 7, and further including first and second amplifier means for respectively and independently amplifying said first signal and said second signal prior to the summing of said signals.

11. Apparatus according to claim 7, wherein said secondary winding means has an impedance constituted by the resistance of said secondary winding means.

12. Apparatus according to claim 7, and further including another transformer having a primary conductor and a secondary winding means, and wherein said primary conductor of said first-mentioned transformer is connected in series with said primary conductor of said other transformer, and said secondary winding means of said first-mentioned transformer is connected in series with said secondary winding means of said other transformer.

13. Apparatus according to claim 7, wherein said transformer core is made of non-laminated soft iron.

* * * * *